(12) United States Patent
Walling et al.

(10) Patent No.: US 12,376,236 B2
(45) Date of Patent: Jul. 29, 2025

(54) METHOD FOR NORMALIZING SOLDER INTERCONNECTS IN A CIRCUIT PACKAGE MODULE AFTER REMOVAL FROM A TEST BOARD

(71) Applicant: Skyworks Solutions, Inc., Irvine, CA (US)

(72) Inventors: James David Walling, Cedar Rapids, IA (US); Jeffrey Sailer, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 113 days.

(21) Appl. No.: 18/303,113

(22) Filed: Apr. 19, 2023

(65) Prior Publication Data
US 2023/0389190 A1 Nov. 30, 2023

Related U.S. Application Data

(60) Provisional application No. 63/363,365, filed on Apr. 21, 2022.

(51) Int. Cl.
*B23K 1/00* (2006.01)
*B23K 3/06* (2006.01)
(Continued)

(52) U.S. Cl.
CPC ......... *H05K 3/1225* (2013.01); *B23K 1/0016* (2013.01); *B23K 3/0638* (2013.01);
(Continued)

(58) Field of Classification Search
CPC ............... H05K 3/1225; H05K 3/1233; H05K 3/3478; H05K 3/3485; H01L 23/552;
(Continued)

(56) References Cited

U.S. PATENT DOCUMENTS 5,060,846 A * 10/1991 Schaeffer ........... H05K 13/0465
228/49.1
5,067,433 A * 11/1991 Doll, Jr. ............... H05K 3/3468
118/500
(Continued)

FOREIGN PATENT DOCUMENTS

CN 1983549 A * 6/2007 ............. B23K 3/087
CN 110013931 A * 7/2019 ......... B05B 13/0292
(Continued)

*Primary Examiner* — Kiley S Stoner
(74) *Attorney, Agent, or Firm* — Knobbe, Martens, Olson & Bear LLP

(57) ABSTRACT

A method for normalizing the solder interconnects (e.g., normalizing the height of the solder ball interconnects) in a circuit package module (e.g., dual-sided mold grid array package module) after removal from a test board includes receiving in a fixture the circuit package module upside down and removably coupling a stencil to the fixture and over the circuit package module. The stencil has a pattern of apertures that coincides with the pattern of solder interconnects of the circuit package module. The method also includes applying solder paste over the stencil to pass through the apertures to add solder paste to the solder interconnects. The method also includes removing the stencil from over the fixture, and removing the circuit package module from the fixture. The circuit package module can be heated to reflow the solder interconnects with the added solder paste.

20 Claims, 13 Drawing Sheets

(51) Int. Cl.
*B23K 37/04* (2006.01)
*H05K 3/12* (2006.01)
*H05K 3/34* (2006.01)

(52) U.S. Cl.
CPC ........... *B23K 37/04* (2013.01); *H05K 3/1233* (2013.01); *H05K 3/3478* (2013.01); *H05K 3/3485* (2020.08)

(58) Field of Classification Search
CPC ........... H01L 25/03; H01L 2225/06506; H01L 2225/0651; H01L 2225/06517; H01L 2225/06558; H01L 2225/06572; H01L 23/49816; H01L 23/49822; H01L 25/0652; H01L 23/3128; H01L 25/0655; B23K 1/0016; B23K 3/0623; B23K 3/0638; B23K 3/087; B23K 37/04–0461
USPC ....... 228/179.1–180.22, 33–41, 248.1–248.5
See application file for complete search history.

(56) References Cited

U.S. PATENT DOCUMENTS

| | | | | |
|---|---|---|---|---|
| 5,392,980 | A * | 2/1995 | Swamy | H01L 23/49811 228/19 |
| 5,782,399 | A * | 7/1998 | Lapastora | H05K 3/4015 228/248.1 |
| 5,910,282 | A * | 6/1999 | Grozdanovski | H05K 3/1225 623/44 |
| 5,988,487 | A * | 11/1999 | MacKay | B23K 35/0222 427/98.5 |
| 6,769,596 | B1 * | 8/2004 | Alghouli | B23K 3/0623 228/119 |
| 9,629,259 | B1 * | 4/2017 | Hart | B23K 1/0016 |
| 2002/0187264 | A1 * | 12/2002 | Mallon | H05K 3/1233 427/282 |
| 2007/0131733 | A1 * | 6/2007 | Cheng | B23K 3/087 228/44.7 |
| 2023/0337369 | A1 * | 10/2023 | Koo | B41N 1/248 |

FOREIGN PATENT DOCUMENTS

| | | | | | |
|---|---|---|---|---|---|
| CN | 110802293 | A | * | 2/2020 | ........... B23K 1/0008 |
| CN | 110890451 | B | * | 5/2023 | ................ C09J 9/02 |
| CN | 117412507 | A | * | 1/2024 | |
| DE | 102016122134 | A1 | * | 6/2017 | ........... B23K 1/0016 |
| DE | 102020202411 | A1 | * | 8/2021 | |
| JP | H11233568 | A | * | 8/1999 | |
| JP | 2000223608 | A | * | 8/2000 | ....... H01L 23/49816 |
| JP | 2006294976 | A | * | 10/2006 | ....... H01L 23/49805 |
| JP | 2020184610 | A | * | 11/2020 | ................ F21K 9/61 |
| JP | 2021501992 | A | * | 1/2021 | |
| KR | 20080048662 | A | * | 6/2008 | |
| KR | 20120021278 | A | * | 3/2012 | |
| KR | 20140000755 | A | * | 1/2014 | |
| KR | 20200109937 | A | * | 9/2020 | |
| KR | 102528910 | B1 | * | 5/2023 | |
| TW | 202339179 | A | * | 10/2023 | ....... G06K 19/06037 |
| WO | WO-2011055487 | A1 | * | 5/2011 | ........... B41F 15/0881 |

* cited by examiner

METHOD FOR NORMALIZING SOLDER INTERCONNECTS IN A CIRCUIT PACKAGE MODULE AFTER REMOVAL FROM A TEST BOARD

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of this disclosure relate to packaging of circuit devices, such as radio frequency modules that can be mounted on a circuit board, and more particularly to a system and method for normalizing solder interconnect members in a dual-sided molded package module after removal from a printed circuit board (e.g., prior to further testing, such as on a product test board).

Description of the Related Art

Prototype circuit package modules must undergo a variety of tests. The circuit package module is mounted to a test board (e.g., printed circuit boards) and then removed from the test board once the test is completed to subsequently mount it to a different test board for a different test. However, removal of the circuit package module from a test board results in the solder balls to have different heights, and such uneven solder balls makes it difficult to remount the package module to a different test board or to clamp to a test fixture.

SUMMARY

The innovations described in the claims each have several aspects, no single one of which is solely responsible for its desirable attributes. Without limiting the scope of the claims, some prominent features of this disclosure will now be briefly described.

In accordance with one aspect of the disclosure, a system and method is provided for normalizing the solder interconnects (e.g., normalizing the height of the solder ball interconnects) in a circuit package module (e.g., a dual-sided mold grid array package module) after removal from a printed circuit board (e.g., prior to further testing, such as on a product test board).

In accordance with another aspect of the disclosure, a system for normalizing solder interconnects of a circuit package module is provided. The system includes a fixture having a recess configured to receive a circuit package module therein in an upside down orientation. The system also includes a stencil configured to be removably coupled to the fixture and disposed over the circuit package module, the stencil having a plurality of apertures arranged in a pattern that coincides with a pattern of a plurality of solder interconnects of the circuit package module. The plurality of apertures are configured to align with the plurality of solder interconnects when the stencil is coupled to the fixture over the circuit package module, the plurality of openings configured to receive a solder paste therethrough and direct the solder paste onto the plurality of solder interconnects.

In accordance with another aspect of the disclosure, a method of normalizing solder interconnects of a circuit package module is provided. The method includes the step of placing a circuit package module upside down in a recess of a fixture so that a plurality of solder interconnects of the circuit package module face out of the fixture. The method also includes the step of coupling a stencil to the fixture so that the stencil is disposed over the circuit package module, the stencil having a plurality of apertures arranged in a pattern that coincides with a pattern of the plurality of solder interconnects of the circuit package module. The method further includes the step of applying a solder paste over the stencil so that the solder paste passes through the plurality of apertures and is added onto the plurality of solder interconnects. The method additionally includes the step of decoupling the stencil from the fixture to expose the circuit package module; removing the circuit package module from the fixture. The method also includes the step of heating the circuit package module to reflow the solder interconnects with the added solder paste.

BRIEF DESCRIPTION OF THE DRAWINGS

Embodiments of this disclosure will now be described, by way of non-limiting example, with reference to the accompanying drawings.

DETAILED DESCRIPTION

Figure 1:
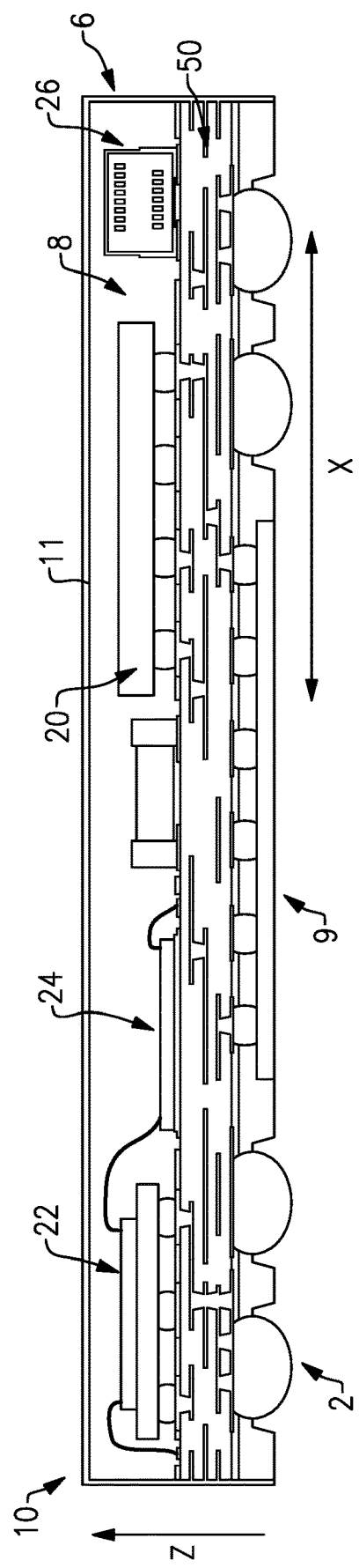
FIG. 1 is a schematic view of an existing dual-sided package module with various electronic components.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 shows a circuit package module 10 (e.g., a dual-sided molded package module, a dual-sided mold grid array package module) with one or more (a plurality of) solder connections (e.g., balls, or other electrical interconnect members) 2 that are connected to an underside of a printed circuit board (PCB) 50. A plurality of electronic components 6 are connected to a top side of the PCB 50, including a wafer level chip scale package (WLCSP) 20, a flip stack 22, a die 24 and a surface mount technology (SMT) package 26. Wirebonds can connect different components. A top mold 8 (e.g., overmold) can be disposed over the electronic components 6. A die 9 (e.g., backside die) is disposed on an underside of the PCB 50. A shield 11 is disposed over the top mold 8 to shield all of the electronic components 6 from electromagnetic (EM) interference from components outside the shield 11. The package module 10 can be mounted on test board (e.g., printed circuit board) for testing. Once commercialized, the package module 10 can be mounted on a phone board or motherboard of an electronic device.

Figure 2:
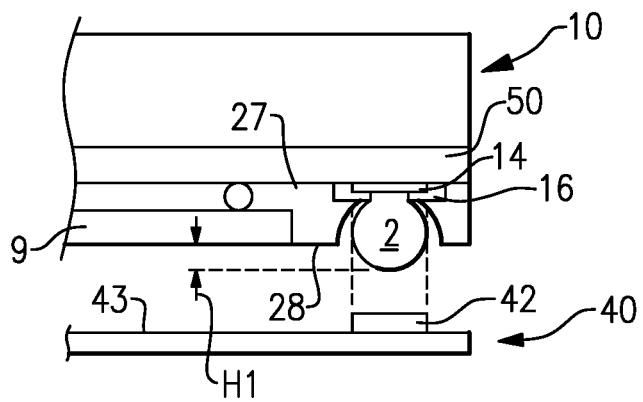
FIG. 2 is a schematic side view of the solder interconnect members in FIG. 1 opposite a pad on a test printed circuit board to which the solder interconnect members are connected.

FIG. 2 shows the enlarged partial view of the package module 10 in FIG. 1 opposite a printed circuit board 40 (e.g., test board) on which the package module 10 is mounted (e.g., to conduct one or more tests). The printed circuit board 40 can have one or more pads 42 disposed on (e.g., attached to, formed on) the printed circuit board 40. The number of pads 42 can correspond to a number of pads 14 of the package module 10, which correspond to the number of solder interconnects 2 (e.g., solder balls). The pads 42 can be made of metal or a metal or another suitable material that provides electrical and/or thermal conductivity between the solder interconnects 2 and the printed circuit board 40.

The package 10 mounts to the printed circuit board 40 via a connection between the solder interconnects 2 and the pads 42. For example, at least a portion of the solder interconnects 2 can be deposited/melted onto the pads 42 (e.g., by applying heat to the solder interconnects 2 causing them to reflow). The package 10 can mount to the printed circuit board so that the bottom surface 28 of a bottom overmold 27 of the package module 10 is spaced apart (e.g., by a gap) from a top surface 43 of the printed circuit board 40, which can inhibit (e.g., prevent) damage to the die 20 due to displacement of the package 10 relative to the printed circuit board 40 (e.g., due to flexing or dropping of the printed circuit board 40 with the package 10 mounted on it. In one implementation, the pads 42 of the printed circuit board have a uniform size that is substantially equal to, for example coincides with, a size of the solder interconnects 2 (e.g., the solder balls 2 have a uniform size), which match the size (e.g., width) of the pads 14 (e.g., the pads 14 have a uniform size), where each of the pads 14 can be covered by a mask 16. Solder interconnects 2 in new package modules 10 can have a height of about 45 µm from the bottom surface 28 of the bottom overmold 27.

Figure 3:
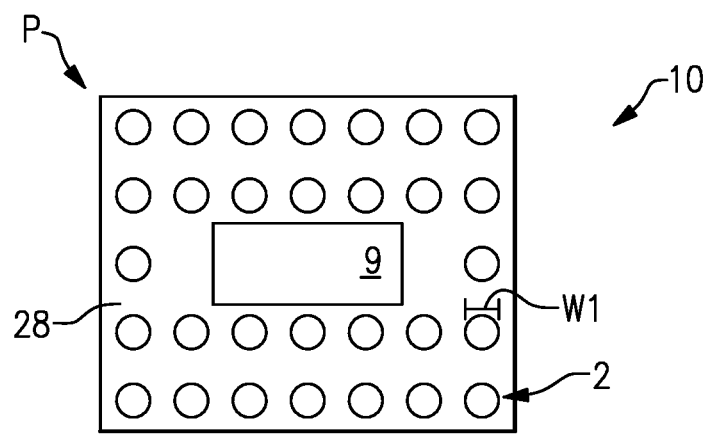
FIG. 3 is a schematic bottom view of the package module of FIG. 1.

FIG. 3 shows a bottom view of the package module 10 in FIG. 1. As discussed above, the solder interconnects 2 can have a uniform size (e.g., substantially the same width at the centerline, diameter at widest portion) W1, and can also have a uniform height H1 (e.g., relative to the bottom surface 28 of the package module 10). The solder interconnects 2 are arranged in a pattern P.

Figure 4:
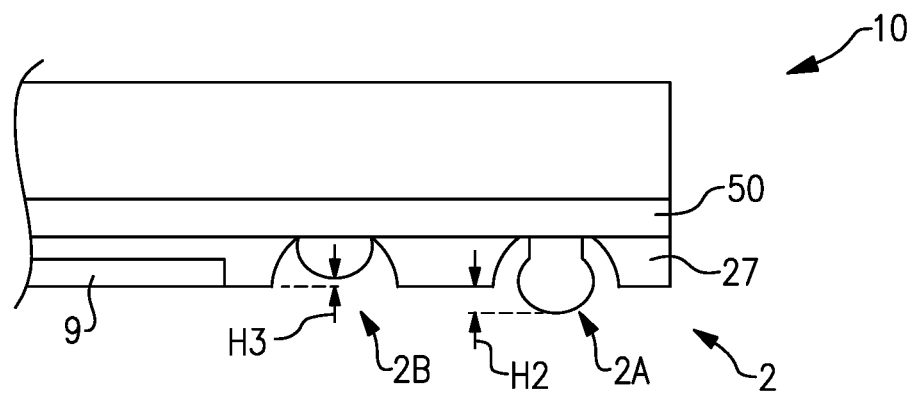
FIG. 4 is a schematic side view of a portion of the package module of FIG. 1 following removal of the module from a test board.

FIG. 4 shows an enlarged partial view of the package module 10 in FIG. 1 following removal from the printed circuit board 40 (e.g., test board), for example after conducting one or more tests on the package module 10. The solder interconnects 2 (e.g., solder balls) can have a non-uniform height, where one or more solder interconnects 2A can have a first height H2 and one or more other solder interconnects 2B can have a second height H3 different from the first height H2, and where they both may differ from the height H1 of the solder interconnects 2 when initially formed. Such variations in heights of the solder interconnects 2 (e.g., height difference between the tallest solder interconnect and shortest solder interconnect, or planarity) can make it difficult to remount the package module 10 to another test board or to clamp it to a test fixture for further testing. Table 1 below shows data of the variation in the height of solder interconnects (e.g. solder balls) following removal or decoupling of the package module from a test board (e.g., printed circuit board). As shown in Table 1, the height of the solder interconnects vary from a minimum of −38 µm (i.e., the solder interconnect being recessed relative to the bottom surface 28 of the bottom overmold 27 by 38 µm) to a maximum of 116 µm (i.e., the solder interconnect protruding relative to the bottom surface 28 of the bottom overmold 27 by 116 µm), with a variation across the package module of at least 44 µm and as much as 118 µm. Pogo pins in test fixtures can handle a variation of between 0 µm and 70 µm, so of the 15 samples in Table 1, only three of the samples would be usable in such a test fixture.

TABLE 1

Variation in Height of Solder Interconnects
Post removal from test board

| Package Module Sample | Ball height Min | Ball height Max | Variation across module |
|---|---|---|---|
| 1 | −21 | 47 | 68 |
| 2 | 6 | 86 | 80 |
| 3 | −25 | 41 | 66 |
| 4 | −2 | 98 | 100 |
| 5 | −38 | 18 | 56 |
| 6 | −33 | 35 | 68 |
| 7 | 21 | 102 | 81 |
| 8 | 16 | 100 | 84 |
| 9 | 7 | 57 | 50 |
| 10 | −21 | 95 | 116 |
| 11 | 0 | 44 | 44 |
| 12 | 21 | 66 | 45 |
| 13 | −41 | 3 | 44 |
| 14 | −2 | 116 | 118 |
| 15 | −9 | 75 | 84 |

FIG. 5-17 show images of a process via which the height of the solder interconnects 2 can be normalized (e.g., planarity reduced) following dismounting of the package module 10 from the printed circuit board 40 (e.g., test board) in order to facilitate (e.g., allow for, make it easier to) remounting the package module 10 to another printed circuit board 40 or to be clamped to a test fixture.

Figure 5:
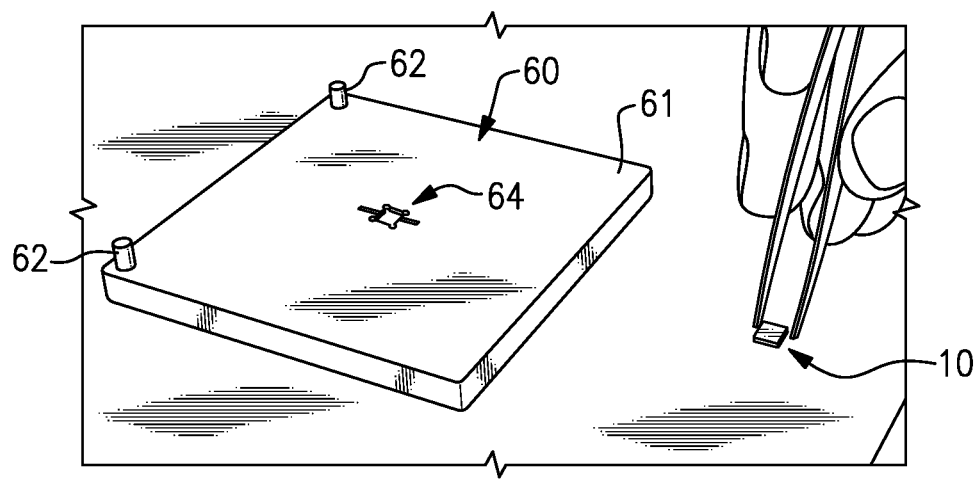
FIG. 5 is a perspective schematic view of a fixture for use in normalizing solder interconnects of the package module of FIG. 1.
Figure 15:
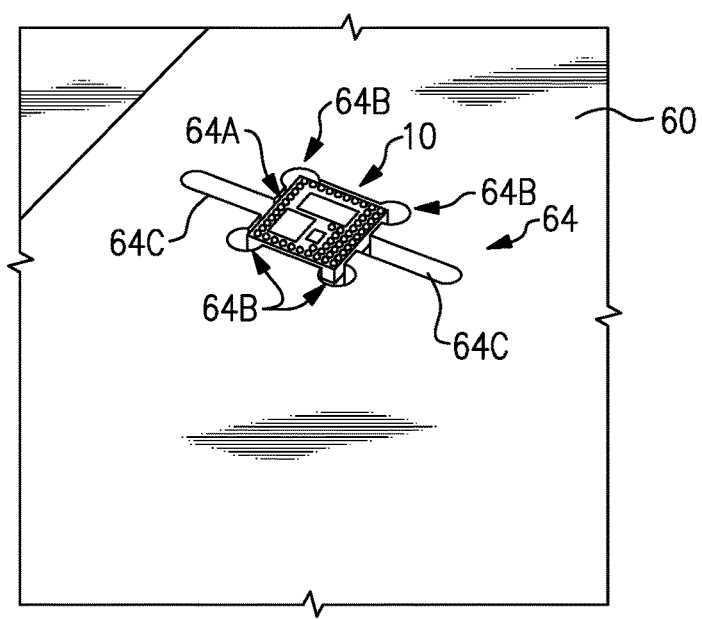
FIG. 15 is a schematic enlarged view of the package module positioned in the fixture following removal of the stencil from over the fixture and after application of solder paste over the stencil at a location over the package.

FIG. 5 shows a fixture 60 with one or more (e.g., a pair of) posts 62 that protrude from a top surface 61 of the fixture 60. In the illustrated implementation, the fixture 60 has a square shape. However, the fixture 60 can have other suitable shapes. In one implementation, the fixture 60 can be made of metal (e.g., aluminum). The fixture 60 includes a recess 64 in the top surface 61 that is sized to receive at least partially therein the package module 10, for example upside down so that the solder interconnects 2 face in the same direction as the top surface 61. As best shown in FIG. 15, the recess 64 includes a pair of slots 64C that extend from and are in communication with a central recess 64A, where the central recess 64A receives the package module 10. The central recess 64A has a shape (e.g., square, rectangular) that coincides with the shape of the package module 10 and is sized to receive the package module 10. The central recess 64A has adjacent edges that are joined by rounded openings 64B that facilitate insertion and removal of the package module 10.

Figure 6:
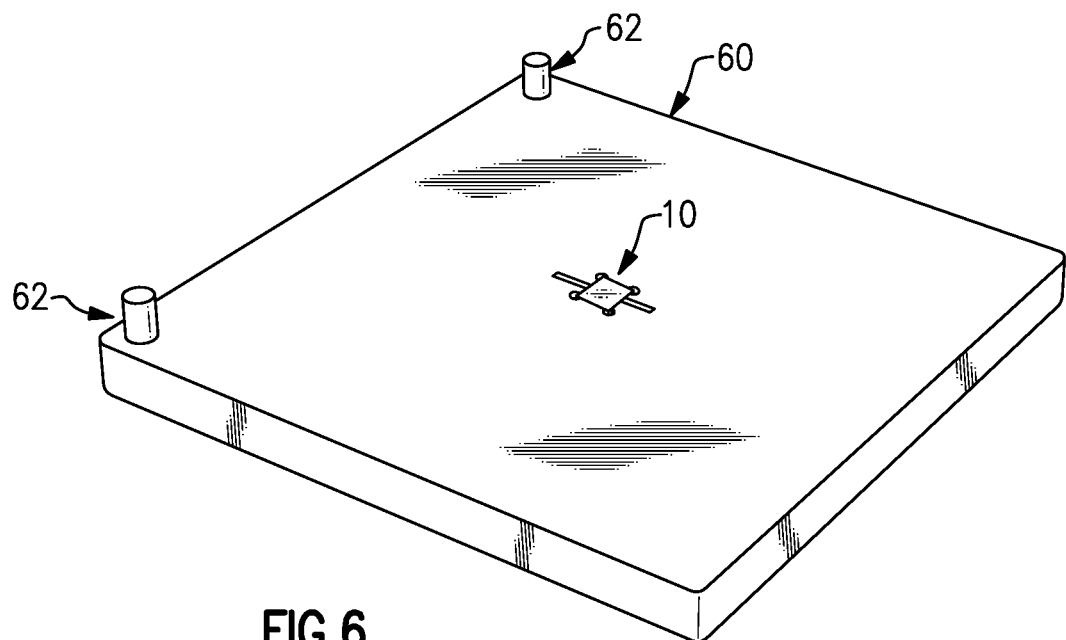
FIG. 6 is a perspective view of the fixture of FIG. 5 with the package module of FIG. 1 positioned upside down in a recess of the fixture.
Figure 7:
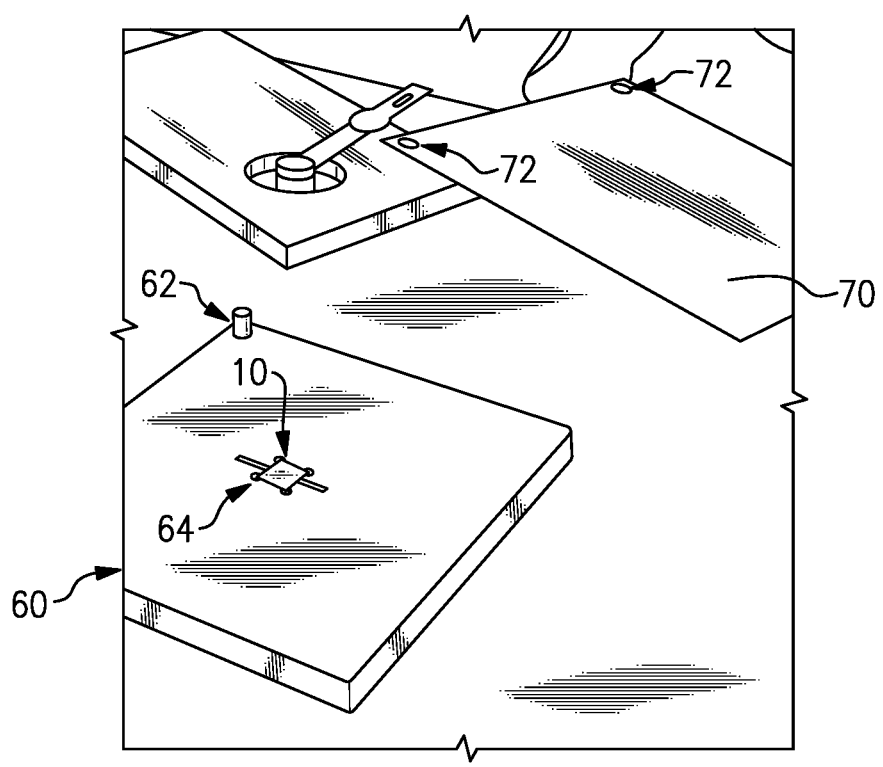
FIG. 7 is a perspective view of the fixture of FIG. 5 with the package module of FIG. 1 positioned upside down in a recess of the fixture, and with a stencil in process of being located over the fixture and package module.
Figure 8:
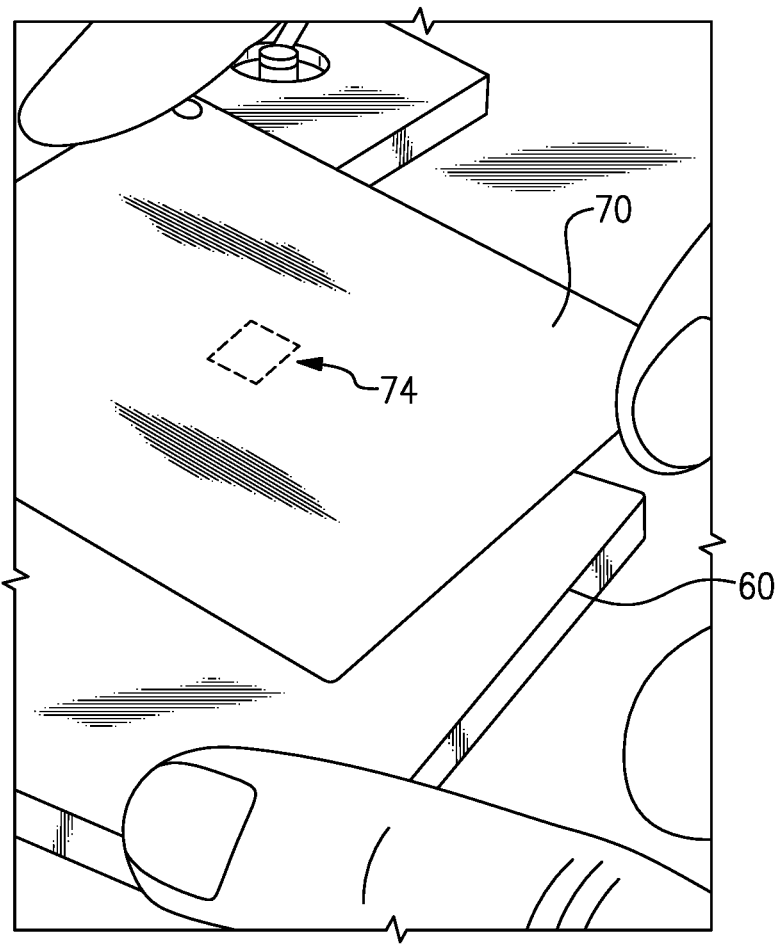
FIG. 8 is a perspective view of the fixture of FIG. 5 with the package module of FIG. 1 positioned upside down in a recess of the fixture, and with a stencil in process of being located over the fixture and package module.
Figure 9:
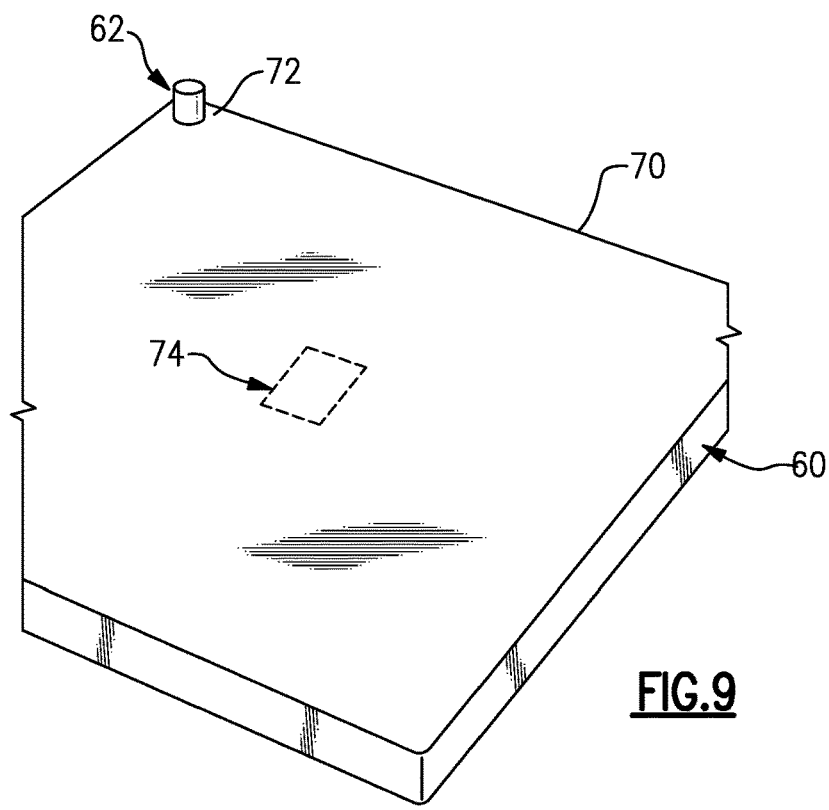
FIG. 9 is a perspective view of the fixture of FIG. 5 with the package module of FIG. 1 positioned upside down in a recess of the fixture, and with a stencil in place over the fixture and package module.

FIG. 6 shows the package module 10 positioned in the recess 64 (e.g., positioned in the central recess 64A) of the fixture 60 (e.g., so that the solder interconnects 2 face out of the fixture 60). FIGS. 7-9 show steps in coupling a stencil 70 to the fixture 60 and over the package module 10 in the recess 64. The stencil 70 has one or more (e.g., a pair of) openings 72 sized to fit over the one or more (e.g., pair of) posts 62 of the fixture 60 to thereby couple the stencil 70 to the fixture 60 and inhibit (e.g., prevent) relative movement (e.g., shifting, sliding) of the stencil 70 relative to the fixture 60. In one implementation, the stencil 70 has the same shape (e.g., size, outer perimeter, covers the same area, has the same projected area) as the fixture 60. In one implementation, the stencil 70 can be made of metal (e.g., sheet metal). The stencil 70 can have a thickness of between approximately 25 microns and 100 microns (i.e., 0.025 mm and 0.1 mm).

Figure 10:
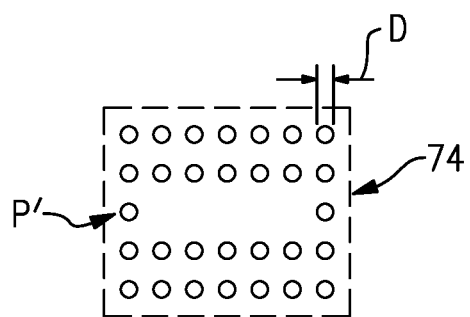
FIG. 10 is a top view of a portion of the stencil.

FIG. 10 shows a top view of a portion of the stencil 70. The stencil 70 has a plurality of apertures 74 that extend completely through the stencil 70 and are arranged in a pattern P' that coincides with the pattern P of solder interconnects 2 of the package module 10. The apertures 74 are located on the stencil 70 so that the apertures 74 align with the solder interconnects 2 of the package module 10 when the stencil 70 is coupled to the fixture 60 (e.g., when the stencil 70 is placed over the fixture 60 so that the posts 62 of the fixture 60 extend through the openings 72 of the stencil 70). The apertures 74 can have a diameter D of between 150 microns and 300 microns (e.g., 150 µm, 200 µm, 225 µm, 250 µm, 300 µm). All of the apertures 74 can have the same diameter D.

Figure 11:
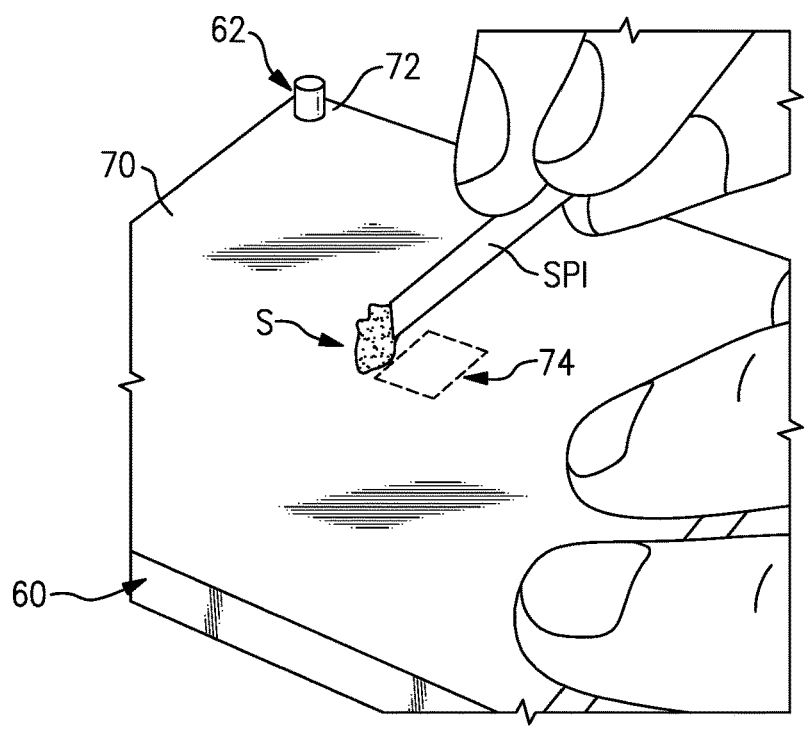
FIG. 11 is a perspective view of the stencil disposed over the fixture and package module, and with solder paste being applied over the stencil at a location over the package module.
Figure 12:
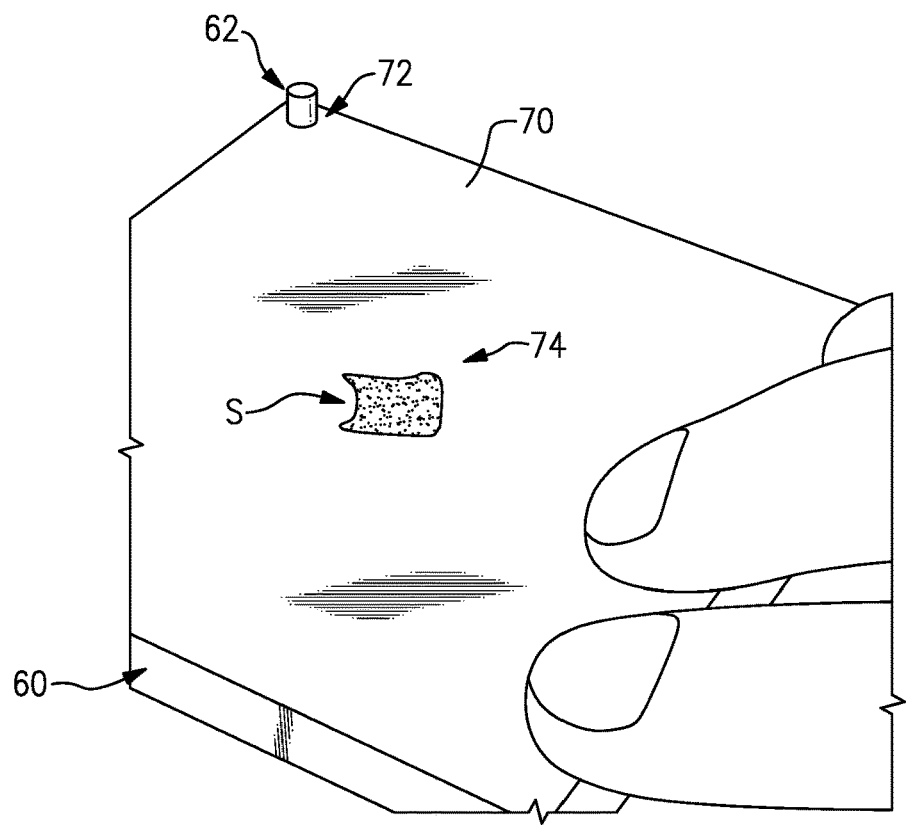
FIG. 12 is a perspective view of the stencil disposed over the fixture and package module, following application of solder paste over the stencil at a location over the package module.
Figure 13:
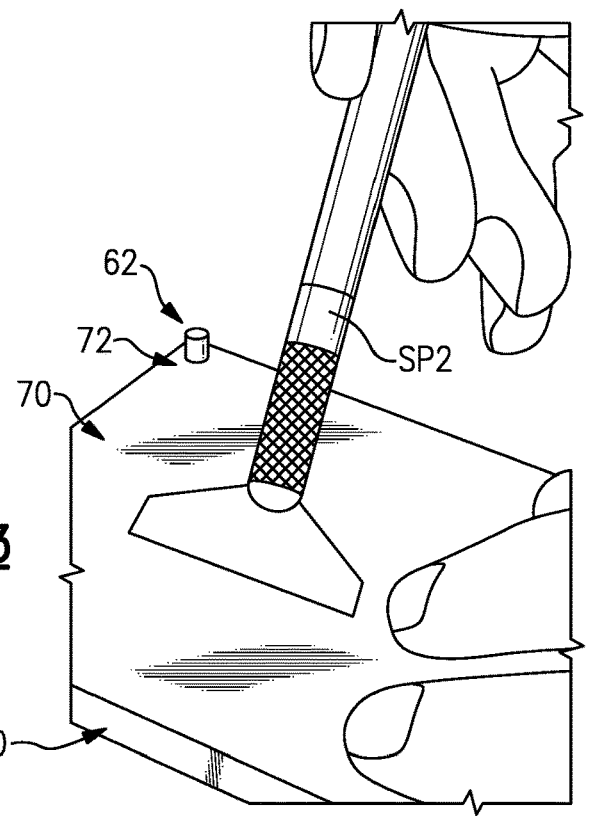
FIG. 13 is a perspective view of the stencil disposed over the fixture and package module, and with a scraper passed over the stencil following application of solder paste over the stencil at a location over the package module.

FIGS. 11-13 shows the application of solder paste S over the stencil 70 at a location over the pattern P' of apertures 74 while the stencil 70 is fixed (e.g., via the posts 62 and openings 72) to the fixture 60. In the illustrated implementation, the solder paste S is applied with a spatula SP1. Since the stencil 70 is fixed to the fixture 60, the apertures 74 are aligned with the solder interconnects 2 of the package module 10 disposed upside down in the central recess 64B of the fixture, and application of the solder paste S over the apertures 74 adds solder paste to the solder interconnects 2 in different amounts (e.g., based on the different heights of the existing solder interconnects 2) so that the height of the solder interconnects 2 will normalize once reflowed, as discussed further below. FIG. 12 shows the top of the stencil 70 after the solder paste S has been applied over the apertures 74. As shown in FIG. 13, a spatula SP2 (e.g., a wide edge spatula) can be slid or scraped across the surface of the stencil 70 to fill the apertures 74 with the solder paste S (e.g., to ensure the apertures 74 are uniformly filled with the solder paste S).

Figure 14:
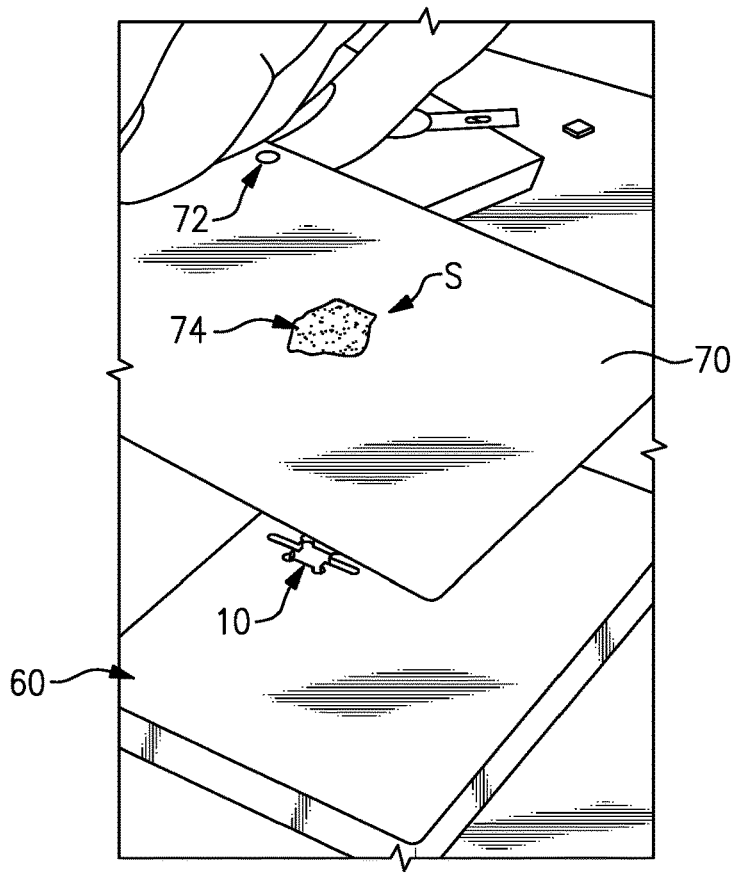
FIG. 14 is a perspective view of the removal of the stencil from over the fixture following application of solder paste over the stencil at a location over the package module.

As shown in FIG. 14, following application of the solder paste S over the stencil 70 so that the solder paste is added to the solder interconnects 2, the stencil 70 is decoupled from the fixture 60 and removed. FIG. 15 shows the top of the fixture 60 with the package module 10 in the recess 64 (e.g., in the central recess 64A) following application of the solder paste S.

Figure 16:
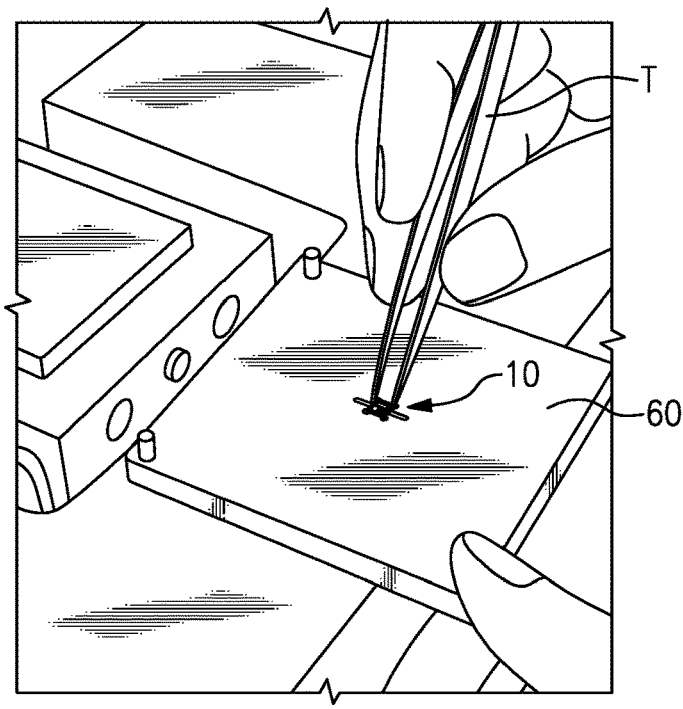
FIG. 16 is a schematic view of the package module being removed from the fixture in FIG. 15.
Figure 17:
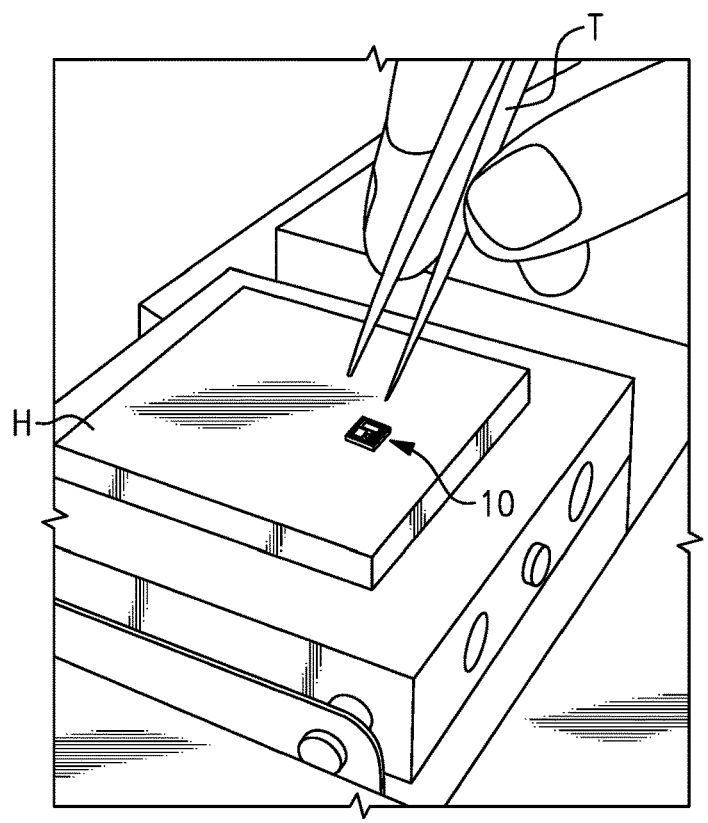
FIG. 17 is a schematic view of positioning the package module in an upside down orientation on a heating plate to cause the solder interconnects to reflow.

FIG. 16 shows the removal of the package module 10 with the added solder paste S from the fixture 60. In implementation, tweezers T can be used to remove the package module 10 (e.g., with the prongs extending into the slots 64C proximate the edges of the package module 10 and actuated to engage the edges of the package module 10). As shown in FIG. 17, once removed from the fixture 60, the package module 10 can be placed on a hot plate H or in a reflow oven to apply heat to the package module 10 so that the solder interconnects 2 reflow (e.g., into a ball shape having a substantially uniform height).

The inventors conducted several tests of the method for normalizing solder interconnects (such as solder interconnects 2) on a package module (such as package module 10). The tests are summarized in the tables below. Table 2 below shows the results of one set of tests for normalizing (e.g., make more uniform) the height of the solder interconnects (e.g., solder balls) of a package module following removal from a test board (e.g., printed circuit board). The stencil (e.g., stencil 70) used in these tests had openings (e.g., apertures 74) with a diameter of 225 µm. The use of the stencil to apply solder paste (e.g., solder paste S) in the manner shown in FIGS. 5-17 advantageously resulted in an improvement in planarity, with all samples tested showing marked improvement. After the application of solder paste, the solder interconnects had a planarity (e.g., variation in solder interconnect height between the tallest and shortest solder interconnect) of no more than 16 µm, as compared to a planarity at least 44 µm before the application of solder paste. Additionally, the solder interconnects had a height that varied between 52 µm and 93 µm across the sample size of package modules tested, which compares to the solder ball height of 45 µm for new package modules.

TABLE 2

Normalization of Solder Interconnects in Package Module

| Package module sample number | Following Removal from Test Board Ball height | | After stencil/reflow | | | Delta | | Planarity | |
|---|---|---|---|---|---|---|---|---|---|
| | Min | Max | Stencil used | Min | Max | Short ball | Tall Ball | before | after |
| 11 | 0 | 44 | 225 | 61 | 67 | 61 | 23 | 44 | 6 |
| 12 | 21 | 66 | 225 | 74 | 75 | 53 | 9 | 45 | 1 |
| 13 | −41 | 3 | 225 | 52 | 56 | 93 | 53 | 44 | 4 |
| 14 | −2 | 116 | 225 | 79 | 93 | 81 | −23 | 118 | 14 |
| 15 | −9 | 75 | 225 | 59 | 75 | 68 | 0 | 84 | 16 |

Table 3 below shows the results of a second set of tests for normalizing (e.g., make more uniform) the height of the solder interconnects (e.g., solder balls) of a package module following removal from a test board (e.g., printed circuit board). The stencil (e.g., stencil 70) used in these tests had openings (e.g., apertures 74) with a diameter of 225 µm. The use of the stencil to apply solder paste (e.g., solder paste S) in the manner shown in FIGS. 5-17 advantageously resulted in an improvement in planarity, with all samples tested showing marked improvement. After the application of solder paste, the solder interconnects had a planarity (e.g., variation in solder interconnect height between the tallest and shortest solder interconnect) of about 13 µm on average across the sample size of package modules tested and less than 30 µm for all sample package modules tested, whereas the planarity of the solder interconnects was about 60 µm on average across the sample size of package modules before the application of solder paste. Additionally, the solder interconnects had a height that varied between 57 µm and 122 µm across the sample size of package modules tested, which compares to the solder ball height of 45 µm for new package modules. Additionally, the time to re-ball the solder interconnects of the package modules samples was approximately 20 minutes.

Table 4 below shows the results of a second set of tests for normalizing (e.g., make more uniform) the height of the solder interconnects (e.g., solder balls) of a package module following removal from a test board (e.g., printed circuit board). The stencil (e.g., stencil 70) used in these tests had openings (e.g., apertures 74) with a diameter of 225 µm. The use of the stencil to apply solder paste (e.g., solder paste S) in the manner shown in FIGS. 5-17 advantageously resulted in an improvement in planarity, with all samples tested showing marked improvement. After the application of solder paste, the solder interconnects had a planarity (e.g., variation in solder interconnect height between the tallest and shortest solder interconnect) of about 16 µm on average across the sample size of package modules tested and less than 25 µm for all sample package modules tested (with sample 1 having being outlier with a planarity of 55), whereas the planarity of the solder interconnects was about 62 µm on average across the sample size of package modules before the application of solder paste. Additionally, the solder interconnects had a height that varied between 51 µm and 117 µm across the sample size of package modules tested, which compares to the solder ball height of 45 µm for new package modules. Additionally, the time to re-ball the solder interconnects of the package modules samples was approximately 30 minutes.

TABLE 3

Normalization of Solder Interconnects in Package Module

| Package module sample number | Following Removal from Test Board Ball height | | After stencil/reflow | | | | | | |
|---|---|---|---|---|---|---|---|---|---|
| | | | Ball height | | Increase in Height | | Planarity | | |
| | Min | Max | Min | Max | Short ball | Tall Ball | before | after | |
| 1 | 25 | 45 | 68 | 75 | 43 | 30 | 20 | 7 | |
| 2 | 6 | 45 | 57 | 84 | 51 | 39 | 39 | 27 | |
| 3 | 21 | 70 | 84 | 98 | 63 | 28 | 49 | 14 | |
| 4 | 9 | 61 | 70 | 68 | 61 | 7 | 52 | 2 | |
| 5 | 36 | 92 | 98 | 105 | 62 | 13 | 56 | 7 | |
| 6 | 35 | 100 | 101 | 112 | 66 | 12 | 65 | 11 | |
| 7 | 10 | 123 | 63 | 87 | 53 | −36 | 113 | 24 | |
| 8 | −7 | 90 | 83 | 100 | 90 | 10 | 97 | 17 | |
| 9 | 7 | 116 | 95 | 122 | 88 | 6 | 109 | 27 | |
| 10 | 13 | 60 | 60 | 72 | 73 | 12 | 73 | 12 | |
| 11 | 11 | 59 | 62 | 75 | 51 | 16 | 48 | 13 | |
| 12 | 0 | 55 | 71 | 73 | 71 | 18 | 55 | 2 | |
| 13 | 12 | 70 | 64 | 58 | 52 | −12 | 58 | 6 | |
| 14 | 12 | 36 | 65 | 81 | 53 | 45 | 24 | 16 | |
| 15 | 32 | 68 | 83 | 97 | 51 | 29 | 36 | 14 | |
| Average | 13.07 | 72.67 | 74.93 | 87.13 | 61.87 | 14.47 | 59.60 | 13.27 | |

TABLE 4

Normalization of Solder Interconnects in Package Module

| Package module sample number | Following Removal from Test Board Ball height | | After stencil/reflow | | | | | |
|---|---|---|---|---|---|---|---|---|
| | | | Ball height | | Increase in Height | | Planarity | |
| | Min | Max | Min | Max | Short ball | Tall Ball | before | after |
| 1 | 7 | 88 | 62 | 117 | 55 | 29 | 81 | 55 |
| 2 | 17 | 83 | 55 | 79 | 38 | −4 | 66 | 24 |
| 3 | −61 | 45 | 60 | 64 | 121 | 19 | 106 | 4 |
| 4 | 13 | 64 | 74 | 91 | 61 | 27 | 51 | 17 |
| 5 | 19 | 55 | 61 | 69 | 42 | 14 | 36 | 8 |
| 6 | 20 | 82 | 74 | 92 | 54 | 10 | 62 | 18 |
| 7 | 20 | 58 | 69 | 72 | 49 | 14 | 38 | 3 |
| 8 | −25 | 33 | 59 | 71 | 84 | 38 | 58 | 12 |
| 9 | 8 | 88 | 65 | 84 | 57 | −4 | 80 | 19 |
| 10 | 7 | 79 | 77 | 88 | 70 | 9 | 72 | 11 |
| 11 | −9 | 9 | 51 | 65 | 60 | 56 | 18 | 14 |
| 12 | 8 | 86 | 59 | 71 | 51 | −15 | 78 | 12 |
| 13 | 23 | 62 | 67 | 72 | 44 | 10 | 39 | 5 |
| 14 | 20 | 96 | 67 | 87 | 47 | −9 | 76 | 20 |
| 15 | | | | | | | | |
| Average | 4.79 | 66.29 | 64.29 | 80.14 | 59.50 | 13.86 | 61.50 | 15.86 |

Figure 18:
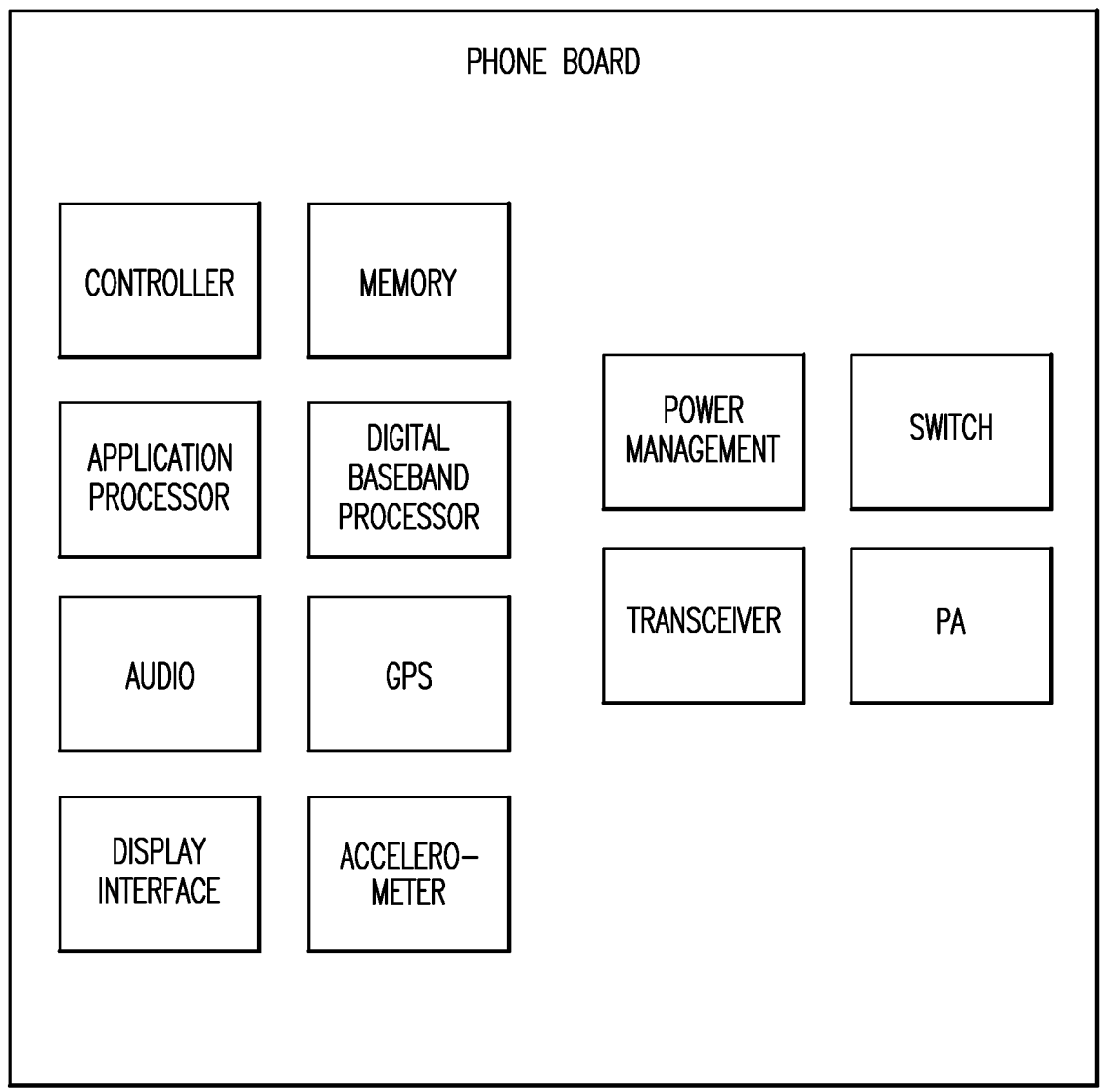
FIG. 18 shows one or more package modules that are mounted on a wireless phone board that can include one or more features described herein.

FIG. 18 shows that in some embodiments, one or more modules included in a circuit board such as a wireless phone board can include one or more of the dual sided molded package module 10 of FIG. 1, as described herein. Non-limiting examples of modules that can benefit from such packaging features include, but are not limited to, a controller module, an application processor module, an audio module, a display interface module, a memory module, a digital baseband processor module, a global positioning system (GPS) module, an accelerometer module, a power management module, a transceiver module, a switching module, and a power amplifier module.

Figure 19:
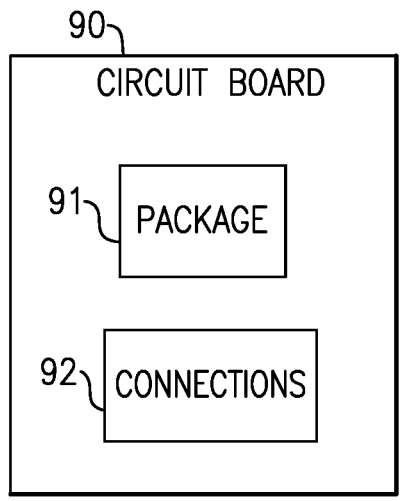
FIG. 19 schematically depicts the circuit board with the package module of FIG. 1 installed thereon.
Figure 20:
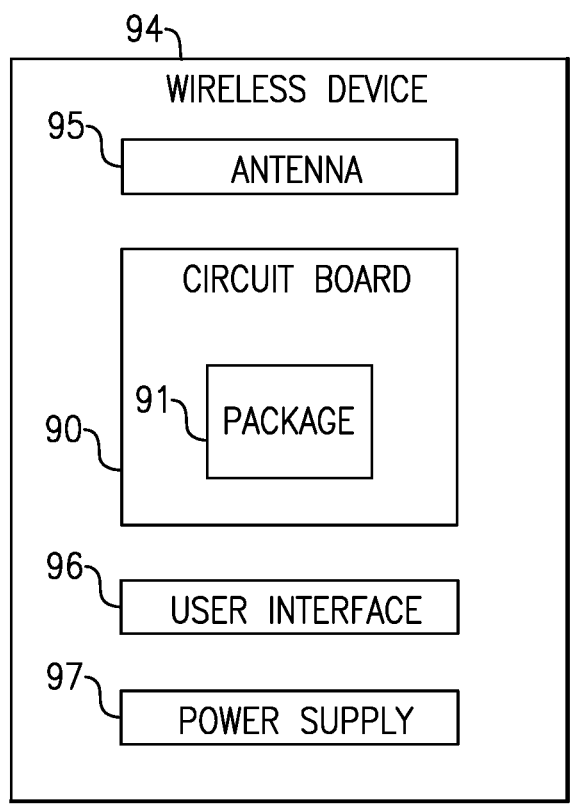
FIG. 20 schematically depicts a wireless device having the circuit board with the package module of FIG. 1 installed thereon.

FIG. 19 schematically depicts a circuit board 90 having a package (e.g., die, SMT package, filter) 91 mounted thereon in the manner described herein (e.g., the package 91 can be a dual sided molded package module 10 of FIG. 1). The circuit board 90 can also include other features such as a plurality of connections 92 to facilitate operations of various packages mounted thereon. FIG. 20 schematically depicts a wireless device 94 (e.g., a cellular phone) having a circuit board 90 (e.g., a phone board). The circuit board 90 is shown to include a package (e.g., die, SMT package, filter) 91 mounted thereon in the manner described herein (e.g., the package 91 can be a dual sided molded package module 10 of FIG. 1). The wireless device is shown to further include other components, such as an antenna 95, a user interface 96, and a power supply 97.

Figure 21:
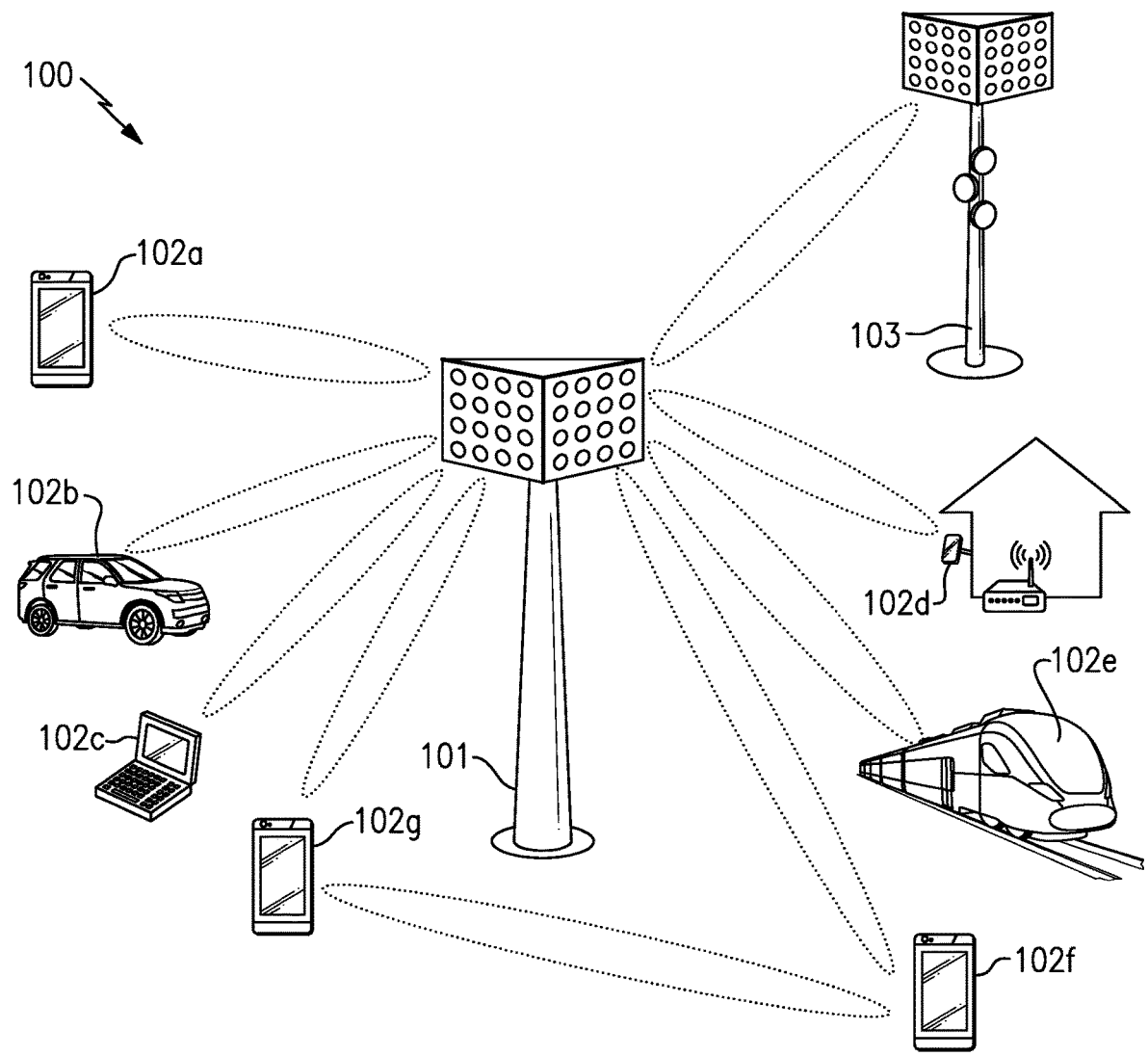
FIG. 21 is a schematic diagram of one example of a communication network.

FIG. 21 is a schematic diagram of one example of a communication network 100. The communication network 100 includes a macro cell base station 101, a small cell base station 103, and various examples of user equipment (UE), including a first mobile device 102a, a wireless-connected car 102b, a laptop 102c, a stationary wireless device 102d, a wireless-connected train 102e, a second mobile device 102f, and a third mobile device 102g.

Although specific examples of base stations and user equipment are illustrated in FIG. 21, a communication network can include base stations and user equipment of a wide variety of types and/or numbers.

For instance, in the example shown, the communication network 100 includes the macro cell base station 101 and the small cell base station 103. The small cell base station 103 can operate with relatively lower power, shorter range, and/or with fewer concurrent users relative to the macro cell base station 101. The small cell base station 103 can also be referred to as a femtocell, a picocell, or a microcell. Although the communication network 100 is illustrated as including two base stations, the communication network 100 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 100 of FIG. 21 supports communications using a variety of cellular technologies, including, for example, 4G LTE and 5G NR. In certain implementations, the communication network 100 is further adapted to provide a wireless local area network (WLAN), such as WiFi. Although various examples of communication technologies have been provided, the communication network 100 can be adapted to support a wide variety of communication technologies.

Various communication links of the communication network 100 have been depicted in FIG. 21. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 21, the communication links include not only communication links between UE and base stations, but also UE to UE communications and base station to base station communications. For example, the communication network 100 can be implemented to support self-fronthaul and/or self-backhaul (for instance, as between mobile device 102g and mobile device 102o).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1) in the range of about 410 MHz to about 7.125 GHz, Frequency Range 2 (FR2) in the range of about 24.250 GHz to about 52.600 GHz, or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 100 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 100 of FIG. 21 can be used to support a wide variety of advanced communication features, including, but not limited to, eMBB, uRLLC, and/or mMTC.

Figure 22:
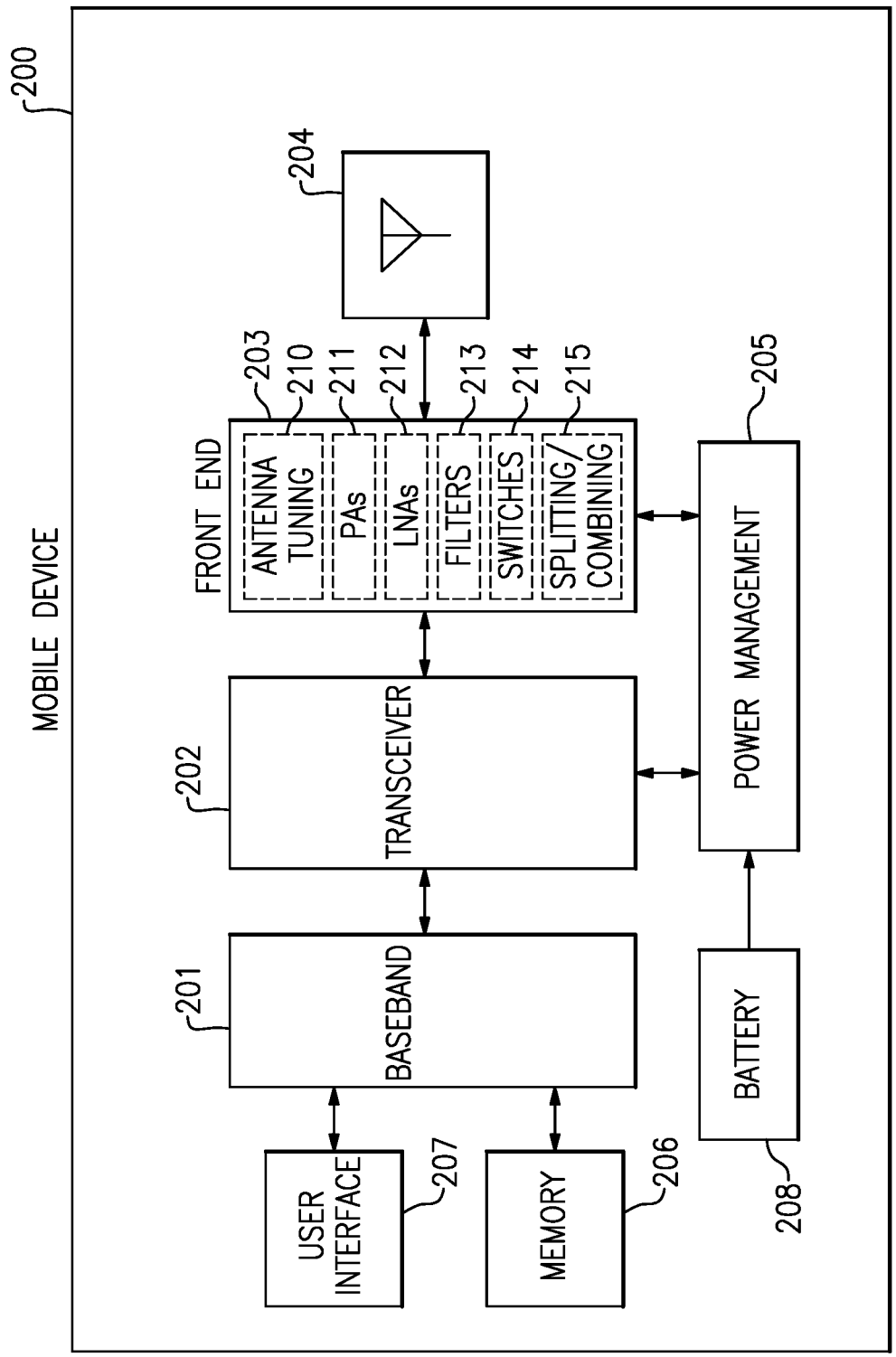
FIG. 22 is a schematic diagram of one embodiment of a mobile device.

FIG. 22 is a schematic diagram of one embodiment of a mobile device 200. The mobile device 200 includes a baseband system 201, a transceiver 202, a front end system 203, antennas 204, a power management system 205, a memory 206, a user interface 207, and a battery 208.

The mobile device 200 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 202 generates RF signals for transmission and processes incoming RF signals received from the antennas 204. It will be understood that various functionalities associated with the transmission and receiving of RF signals can be achieved by one or more components that are collectively represented in FIG. 22 as the transceiver 202. In one example, separate components (for instance, separate circuits or dies) can be provided for handling certain types of RF signals.

The front end system 203 aids in conditioning signals transmitted to and/or received from the antennas 204. In the illustrated embodiment, the front end system 203 includes antenna tuning circuitry 210, power amplifiers (PAs) 211, low noise amplifiers (LNAs) 212, filters 213, switches 214, and signal splitting/combining circuitry 215. However, other implementations are possible.

For example, the front end system 203 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 200 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 204 can include antennas used for a wide variety of types of communications. For example, the antennas 204 can include antennas for transmitting and/or receiving signals associated with a wide variety of frequencies and communications standards.

In certain implementations, the antennas 204 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 200 can operate with beamforming in certain implementations. For example, the front end system 203 can include amplifiers having controllable gain and phase shifters having controllable phase to provide beam formation and directivity for transmission and/or reception of signals using the antennas 204. For example, in the context of signal transmission, the amplitude and phases of the transmit signals provided to the antennas 204 are controlled such that radiated signals from the antennas 204 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 204 from a particular direction. In certain implementations, the antennas 204 include one or more arrays of antenna elements to enhance beamforming.

The baseband system 201 is coupled to the user interface 207 to facilitate processing of various user input and output (I/O), such as voice and data. The baseband system 201 provides the transceiver 202 with digital representations of transmit signals, which the transceiver 202 processes to generate RF signals for transmission. The baseband system 201 also processes digital representations of received signals provided by the transceiver 202. As shown in FIG. 10, the baseband system 201 is coupled to the memory 206 of facilitate operation of the mobile device 200.

The memory 206 can be used for a wide variety of purposes, such as storing data and/or instructions to facilitate the operation of the mobile device 200 and/or to provide storage of user information.

The power management system 205 provides a number of power management functions of the mobile device 200. In certain implementations, the power management system 205 includes a PA supply control circuit that controls the supply voltages of the power amplifiers 211. For example, the power management system 205 can be configured to change the supply voltage(s) provided to one or more of the power amplifiers 211 to improve efficiency, such as power added efficiency (PAE).

As shown in FIG. 22, the power management system 205 receives a battery voltage from the battery 208. The battery 208 can be any suitable battery for use in the mobile device 200, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of normalizing solder interconnects of a circuit package module comprising:
    placing a circuit package module upside down in a recess of a fixture so that a plurality of solder interconnects of the circuit package module face out of the fixture;
    coupling a stencil to the fixture so that the stencil is disposed over the circuit package module, the stencil having a plurality of apertures arranged in a pattern that coincides with a pattern of the plurality of solder interconnects of the circuit package module;
    applying a solder paste over the stencil so that the solder paste passes through the plurality of apertures and is added onto the plurality of solder interconnects;
    decoupling the stencil from the fixture to expose the circuit package module;
    removing the circuit package module from the fixture; and
    heating the circuit package module to reflow the solder interconnects with the added solder paste.

2. The method of claim 1 wherein the plurality of apertures have a diameter of between 150 µm and 300 µm.

3. The method of claim 2 wherein the plurality of apertures have a diameter of 225 µm.

4. A method of normalizing solder interconnects of a circuit package module comprising:
    placing a circuit package module upside down in a recess of a fixture so that a plurality of solder interconnects of the circuit package module face out of the fixture;
    coupling a stencil to the fixture so that the stencil is disposed over the circuit package module and so that the stencil is placed over the fixture so that one or more posts of the fixture that protrude from a surface of the fixture extend through one or more openings of the stencil, the stencil having a plurality of apertures arranged in a pattern that coincides with a pattern of the plurality of solder interconnects of the circuit package module, the fixture having a pair of posts and the stencil having a pair of openings;
    applying a solder paste over the stencil so that the solder paste passes through the plurality of apertures and is added onto the plurality of solder interconnects;
    decoupling the stencil from the fixture to expose the circuit package module;
    removing the circuit package module from the fixture; and
    heating the circuit package module to reflow the solder interconnects with the added solder paste.

5. The method of claim 1 wherein heating the circuit package module includes placing the circuit package module on a hot plate.

6. The method of claim 1 wherein applying the solder paste over the stencil so that the solder paste passes through the plurality of apertures includes scraping the solder paste over the stencil.

7. The method of claim 1 wherein decoupling the stencil from the fixture to expose the circuit package module includes lifting the stencil from over the fixture.

8. The method of claim 1 wherein removing the circuit package module from the fixture includes inserting a pair of tweezer prongs in slots of the recess that are adjacent a central recess of the recess.

9. The method of claim 4 wherein the plurality of apertures have a diameter of between 150 µm and 300 µm.

10. The method of claim 9 wherein the plurality of apertures have a diameter of 225 µm.

11. The method of claim 4 wherein heating the circuit package module includes placing the circuit package module on a hot plate.

12. The method of claim 4 wherein applying the solder paste over the stencil so that the solder paste passes through the plurality of apertures includes scraping the solder paste over the stencil.

13. The method of claim 4 wherein decoupling the stencil from the fixture to expose the circuit package module includes lifting the stencil from over the fixture.

14. The method of claim 4 wherein removing the circuit package module from the fixture includes inserting a pair of tweezer prongs in slots of the recess that are adjacent a central recess of the recess.

15. The method of claim 14 wherein the slots are linear slots.

16. The method of claim 15 wherein the slots are a pair of slots located on opposite sides of the central recess.

17. The method of claim 8 wherein the slots are linear slots.

18. The method of claim 17 wherein the slots are a pair of slots located on opposite sides of the central recess.

19. The method of claim 1 wherein the stencil and the fixture have a same projected area.

20. The method of claim 4 wherein the stencil and the fixture have a same projected area.

* * * * *